US012733291B2

(12) United States Patent
Hu et al.

(10) Patent No.: US 12,733,291 B2
(45) Date of Patent: Sep. 8, 2026

(54) BACK CONTACT SOLAR CELL AND METHOD FOR PREPARING SAME, AND BATTERY ASSEMBLY

(71) Applicant: Trina Solar Co., Ltd., Changzhou (CN)

(72) Inventors: Yunyun Hu, Changzhou (CN); Guangtao Yang, Changzhou (CN); Yifeng Chen, Changzhou (CN)

(73) Assignee: Trina Solar Co., Ltd., Changzhou (CN)

( * ) Notice: Subject to any disclaimer, the term of this patent is extended or adjusted under 35 U.S.C. 154(b) by 0 days.

(21) Appl. No.: 18/823,722

(22) Filed: Sep. 4, 2024

(65) Prior Publication Data

US 2025/0287723 A1 Sep. 11, 2025

Related U.S. Application Data

(63) Continuation of application No. PCT/CN2024/101579, filed on Jun. 26, 2024.

(30) Foreign Application Priority Data

Mar. 11, 2024 (CN) ......................... 202410274595.3

(51) Int. Cl.
*H10F 77/30* (2025.01)
*H10F 71/00* (2025.01)
(Continued)

(52) U.S. Cl.
CPC ........... *H10F 77/311* (2025.01); *H10F 71/10* (2025.01); *H10F 71/103* (2025.01);
(Continued)

(58) Field of Classification Search
None
See application file for complete search history.

(56) References Cited

U.S. PATENT DOCUMENTS

2008/0023068 A1* 1/2008 Nakashima ........... H10F 71/138
136/256
2011/0126906 A1* 6/2011 Ko ........................ H10F 77/147
438/73

(Continued)

FOREIGN PATENT DOCUMENTS

CN 1614741 A 5/2005
CN 114068731 A 2/2022

(Continued)

OTHER PUBLICATIONS

English language machine translation of CN-116487454-A. (Year: 2025).*

(Continued)

*Primary Examiner* — Eli S Mekhlin

(57) ABSTRACT

A back contact solar cell includes a semiconductor substrate, a first functional layer, a second functional layer, a laser protection layer, a first electrode structure, and a second electrode structure. The semiconductor substrate has a light-receiving surface and a shady surface. The first functional layer is formed in the first polarity region. The second functional layer is formed in the second polarity region. The laser protection layer is formed on a side of the second functional layer away from the semiconductor substrate and exposes an electrode contact region of the second functional layer. The laser protection layer includes laser absorption material. The first electrode structure is formed on a side of the first functional layer away from the semiconductor substrate. The second electrode structure is formed on a side of the second functional layer away from the semiconductor substrate, and the second electrode structure is in the electrode contact region.

20 Claims, 4 Drawing Sheets

(51) Int. Cl.

| | |
|---|---|
| ***H10F 71/10*** | (2025.01) |
| ***H10F 77/122*** | (2025.01) |
| ***H10F 77/164*** | (2025.01) |
| ***H10F 77/166*** | (2025.01) |
| ***H10F 77/20*** | (2025.01) |

(52) U.S. Cl.
CPC ....... *H10F 71/1224* (2025.01); *H10F 71/129* (2025.01); *H10F 77/122* (2025.01); *H10F 77/1645* (2025.01); *H10F 77/1662* (2025.01); *H10F 77/219* (2025.01)

(56) References Cited

U.S. PATENT DOCUMENTS

| | | | | |
|---|---|---|---|---|
| 2018/0122963 | A1 | 5/2018 | Xu et al. | |
| 2025/0048778 | A1 * | 2/2025 | Hu | H10F 77/219 |
| 2025/0169224 | A1 * | 5/2025 | Lin | H10F 77/1662 |

FOREIGN PATENT DOCUMENTS

| | | | | | |
|---|---|---|---|---|---|
| CN | 115513307 | A | | 12/2022 | |
| CN | 115513309 | A | | 12/2022 | |
| CN | 116053331 | A | | 5/2023 | |
| CN | 116487454 | A | * | 7/2023 | H10F 71/00 |
| CN | 116666468 | A | | 8/2023 | |
| CN | 117174776 | A | | 12/2023 | |
| CN | 117174787 | A | | 12/2023 | |
| CN | 117423763 | A | | 1/2024 | |
| CN | 117637924 | A | | 3/2024 | |
| CN | 118248749 | A | | 6/2024 | |
| WO | WO-2014179368 | A1 | * | 11/2014 | B23K 26/18 |

OTHER PUBLICATIONS

International Search Report dated Sep. 23, 2024 in International Application No. PCT/CN2024/101579. English translation attached.
Written Opinion of the ISA dated Sep. 23, 2024 in International Application No. PCT/CN2024/101579. English translation attached.
First Office Action dated Dec. 7, 2024 received in corresponding patent family application No. CN202410274595.3. English translation attached.
Extended European Search Report dated Oct. 16, 2025 received in corresponding European Application No. EP24809193.6.
First Office Action dated Sep. 4, 2025 received in corresponding patent family application No. AU2024219633.
Second Office Action dated Dec. 10, 2025 received in corresponding patent family application No. AU2024219633.

* cited by examiner

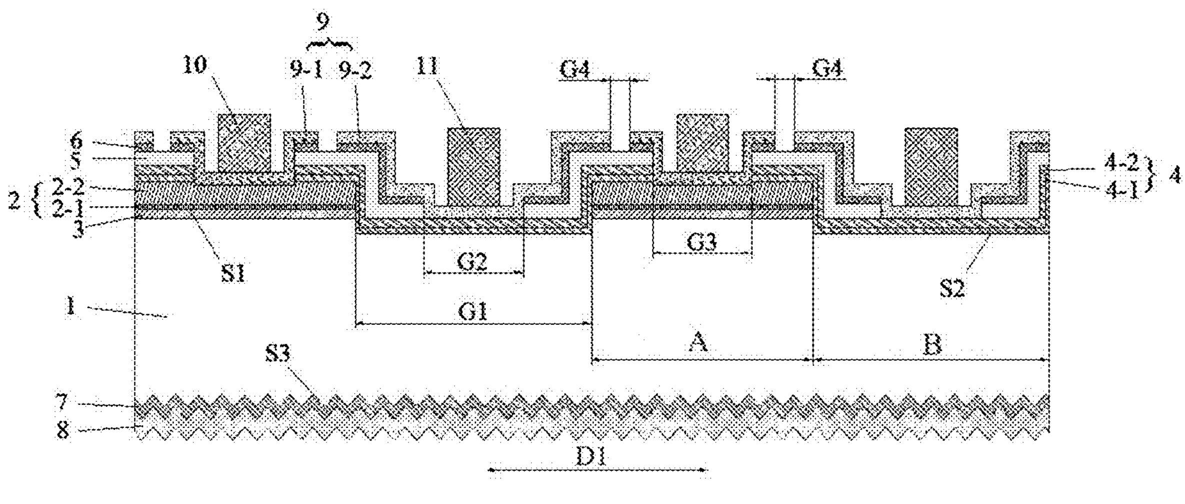

FIG. 1

Providing a semiconductor substrate 1, the semiconductor substrate 1 has a light-receiving surface and a shady surface that are opposite to each other, the shady surface including a first polarity region A and a second polarity region B arranged alternatively in a first direction — 10

↓

Forming a first functional layer 2 in the first polarity region A, the first functional layer including a first passivation layer 2-1 and a first doped semiconductor layer 2-2 that are stacked in a direction away from the semiconductor substrate 1 — 20

↓

Forming a second functional layer 4 in the second polarity region B, the second functional layer 4 including a second passivation layer 4-1 and a second doped semiconductor layer 4-2 that are stacked in a direction away from the semiconductor substrate 1, the first doped semiconductor layer 2-2 has a doping type opposite to a doping type of the second doped semiconductor layer 4-2 — 30

↓

Forming a laser protection layer on a side of the second functional layer 4 away from the semiconductor substrate 1, a material of the laser protection layer including a laser absorption material — 40

↓

Removing a part of a film layer corresponding to an electrode contact region of the first functional layer 2 on a side of the first functional layer 2 away from the semiconductor substrate 1 and a part of a film layer corresponding to an electrode contact region of the second functional layer 4 on the side of the second functional layer 4 away from the semiconductor substrate 1 to expose the electrode contact regions — 50

↓

Forming an electrode structure in each of the electrode contact region of the first functional layer 2 and the electrode contact region of the second functional layer 4 — 60

FIG. 2

BACK CONTACT SOLAR CELL AND METHOD FOR PREPARING SAME, AND BATTERY ASSEMBLY

CROSS-REFERENCE TO RELATED APPLICATION

This application is a continuation of International Application No. PCT/CN2024/101579, filed on Jun. 26, 2024, which claims priority to Chinese Patent Application No. 202410274595.3, filed on Mar. 11, 2024. The disclosures of the aforementioned applications are hereby incorporated by reference in their entireties.

FIELD

This application relates to the field of crystalline silicon solar cells, and particularly, to a back contact solar cell and a method for preparing same, and a battery assembly.

BACKGROUND

As Passivated Emitter and Rear Cell (PERC) technology matures and continues to unlock its potential to gradually approach its theoretical conversion efficiency ceiling, the industry has begun to seek a next generation of technology. Currently, mainstream technologies under advancement include a Tunnel Oxide Passivated Contact (TOPCon) cell, a Heterojunction (HJT) cell, and an Interdigitated back contact (IBC) cell.

Distinguished from a traditional bifacial electrode contact battery, a most remarkable feature of the back contact (BC) cell is that a metal electrode is located on a back surface of the back contact cell. Having no metal electrode to block a front surface of the back contact cell improves a utilization rate of light. Therefore, the back contact cell has a higher short-circuit current and conversion efficiency. Among various back contact technologies, Hybrid Back Contact (HBC) technology has the highest photoelectric conversion efficiency. By adopting a hybrid technology, a passivation contact technology is applied to a back surface of the battery to form the hybrid back contact cell.

Currently, in order to shorten a process flow and increase a production capacity of large-scale mass production of the hybrid back contact cell, a laser film opening technology has also been widely used. However, a laser damage depth is deep, and a cell film layer is easily damaged. In addition, a heterojunction mainly composed of amorphous silicon in the hybrid back contact cell is a low-temperature process (<200° C.), and a film layer grown in the process is sensitive to a thermal effect of the laser with serious thermal attenuation, resulting in a decrease in an open circuit voltage and photoelectric conversion efficiency of the hybrid back contact cell.

SUMMARY

The present disclosure aims to solve at least one of the technical problems in the related art. To this end, the present disclosure proposes a back contact solar cell and a method for preparing same, and a battery assembly to protect a functional layer in a cell from excess laser damage in a laser film opening technology, avoid thermal attenuation of a heterojunction, and improve an open circuit voltage and photoelectric conversion efficiency of the cell.

In a first aspect, the present disclosure provides a back contact solar cell. The back contact solar cell includes a semiconductor substrate, a first functional layer, a second functional layer, a laser protection layer, a first electrode structure, and a second electrode structure. The semiconductor substrate has a light-receiving surface and a shady surface that are opposite to each other. The shady surface includes a first polarity region and a second polarity region that are arranged alternately in a first direction. The first functional layer is formed in the first polarity region. The first functional layer includes a first passivation layer and a first doped semiconductor layer that are stacked in a direction away from the semiconductor substrate. The second functional layer is formed in the second polarity region. The second functional layer includes a second passivation layer and a second doped semiconductor layer that are stacked in the direction away from the semiconductor substrate. The first doped semiconductor layer has a doping type opposite to a doping type of the second doped semiconductor layer. The laser protection layer is formed on a side of the second functional layer away from the semiconductor substrate and exposes an electrode contact region of the second functional layer. A material of the laser protection layer includes a laser absorption material. The first electrode structure is formed on a side of the first functional layer away from the semiconductor substrate. The second electrode structure is formed on a side of the second functional layer away from the semiconductor substrate, and the second electrode structure is located in the electrode contact region.

In a second aspect, the present disclosure provides a method for preparing a back contact solar cell. The method includes: providing a semiconductor substrate, the semiconductor substrate having a light-receiving surface and a shady surface that are opposite to each other, the shady surface comprising a first polarity region and a second polarity region arranged alternately in a first direction; forming a first functional layer in the first polarity region, the first functional layer comprising a first passivation layer and a first doped semiconductor layer that are stacked in a direction away from the semiconductor substrate; forming a second functional layer in the second polarity region, the second functional layer comprising a second passivation layer and a second doped semiconductor layer that are stacked in a direction away from the semiconductor substrate, the first doped semiconductor layer having a doping type opposite to a doping type of the second doped semiconductor layer; forming a laser protection layer on a side of the second functional layer away from the semiconductor substrate, a material of the laser protection layer comprising a laser absorption material; removing a part of a film layer corresponding to an electrode contact region of the first functional layer on a side of the first functional layer away from the semiconductor substrate and a part of a film layer corresponding to an electrode contact region of the second functional layer on the side of the second functional layer away from the semiconductor substrate to expose the electrode contact regions; and forming an electrode structure in each of the electrode contact region of the first functional layer and the electrode contact region of the second functional layer.

In a third aspect, the present disclosure provides a battery assembly. The battery assembly includes the above-mentioned back contact solar cell or includes a back contact solar cell prepared according to the above-mentioned method.

Additional aspects and advantages of the embodiments of present disclosure will be provided at least in part in the following description or will become apparent in part from the following description or can be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings.

FIG. 1 is a cross-sectional structural view of a back contact solar cell according to an embodiment of the present disclosure.

FIG. 2 is a schematic flowchart of a method for preparing a back contact solar cell according to an embodiment of the present disclosure.

Figure 3:
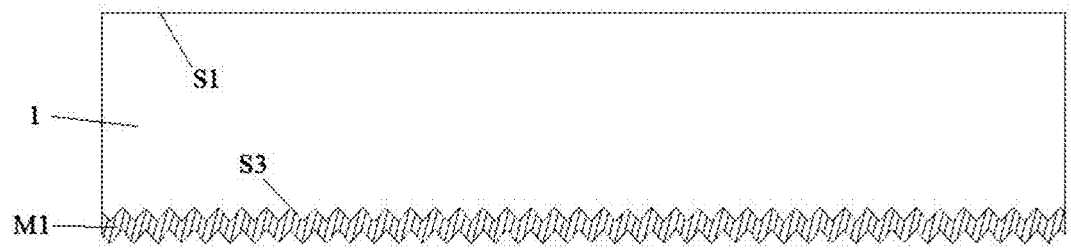
FIG. 3 is a cross-sectional structural view at a first stage of a method for preparing a back contact solar cell according to an embodiment of the present disclosure.

REFERENCE NUMERALS semiconductor substrate 1, first functional layer 2, first passivation layer 2-1, first doped semiconductor layer 2-2, doped substrate layer 3, second functional layer 4, second passivation layer 4-1, second doped semiconductor layer 4-2, insulation dielectric layer 5, laser absorption layer 6, third functional layer 7, anti-reflection layer 8, electroconductive layer 9, first electroconductive layer 9-1, second electroconductive layer 9-2, first electrode 10, second electrode 11, first polarity region A, second polarity region B, first mask M1, second mask M2, first surface S1, second surface S2, third surface S3, first opening G1, second opening G2, third opening G3, and fourth opening G4.

DETAILED DESCRIPTION OF THE EMBODIMENTS

The embodiments of the present disclosure will be described in detail below with reference to examples thereof as illustrated in the accompanying drawings. In the accompanying drawings, sizes of layers, regions, elements and their relative sizes may be exaggerated for clarity. Throughout the description, same or similar elements, or elements having same or similar functions, are denoted by same or similar reference numerals. The embodiments described below with reference to the drawings are illustrative only, and are intended to explain rather than limit the present disclosure.

It should be understood that when an element or layer is referred to as being "on," "adjacent to," "connected to" or "coupled to" other elements or layers, it may be directly on, adjacent to, connected to or coupled to other elements or layers, or there may be intervening elements or layers. On the contrary, when an element is referred to as being "directly on," "directly adjacent to," "directly connected to" or "directly coupled to" elements or layers, there are no intervening elements or layers. It should be understood that although terms "first," "second," "third," etc. may be used to describe various elements, components, regions, layers and/or parts, these elements, components, regions, layers and/or parts should not be limited by these terms. These terms are only used to distinguish one element, component, region, layer or part from another element, component, region, layer or part. Therefore, a first element, component, region, layer or part discussed below may be represented as a second element, component, region, layer or part, without departing from the teachings of the present disclosure. When the second element, component, region, layer or part is discussed, it does not mean that the first element, component, region, layer or part necessarily exists in the present disclosure.

In the description of this specification, descriptions with reference to the terms "an embodiment", "some embodiments", "an exemplary embodiment", "an example", "a specific example", or "some examples" etc., mean that specific features, structure, materials or characteristics described in conjunction with the embodiment or example are included in at least one embodiment or example of the present disclosure. In this specification, the schematic representations of the above terms do not necessarily refer to the same embodiment or example. Moreover, the described specific features, structures, materials or characteristics may be combined in any one or more embodiments or examples in a suitable manner.

In the related art, a hybrid back contact cell generally has a structure of a polished morphology in a tunnel oxide passivated contact region of a back surface, a textured morphology in a heterojunction region of the back surface and in a front surface, and transparent electroconductive oxide on an outermost layer of the back surface. A process flow of this structure is simple. Currently, in order to shorten the process flow and increase a production capacity of large-scale mass production, a laser film opening technology has also been widely used. By analyzing the process flow in the related art, the following problems are found:

1) a laser damage depth is deep, and mask protection is required to prepare a pattern during patterning. However, a conventional mask is difficult to protect film layer below. A heterojunction mainly composed of amorphous silicon is a low-temperature process (<200° C.) in essence, and a film layer grown in the process is sensitive to a thermal effect of the laser with serious thermal attenuation, resulting in a decrease in an open circuit voltage and photoelectric conversion efficiency of the hybrid back contact cell.
2) the outermost layer on the back surface of the hybrid back contact cell is a transparent electroconductive oxide, which has unsatisfactory moisture and heat resistance that affects reliability of the cell and an assembly.
3) interface defects and carrier recombination on the textured surface are more serious than those on the polished surface, resulting in suboptimal passivation of the heterojunction region of the back surface, thereby affecting cell efficiency.

4) wet etching is required after the laser patterning. A first functional layer in a mask protection region is not etched, while a first functional layer in a mask removal region is etched to expose a substrate. Then, a second functional layer is prepared. At a junction of the two regions, since the mask is not easy to be etched, and the first functional layer protected by the mask is easy to be etched, an edge of the mask is protruded and suspended, affecting the preparation and the passivation effect of the second functional layer, resulting in a low open circuit voltage and low conversion efficiency of the cell.

The present disclosure proposes a back contact solar cell and a preparation method therefor, and a battery assembly to solve the above-mentioned problems. Adding the protection layer to the hybrid back contact cell can reduce the damage of the laser to the film layer below an absorption layer, and can improve the cell efficiency; meanwhile, the protection layer can also improve the moisture and heat resistance of the cell and the reliability of the cell and the assembly product. Adopting the fully polished morphology on the back surface of the hybrid back contact cell can reduce the interface defects and carrier recombination in the heterojunction region of the back surface and improve the open circuit voltage and the photoelectric conversion efficiency of the cell. Removing the insulation layer between the two polarity layers can prevent the mask from being protruded and suspended and improve the open circuit voltage and the conversion efficiency of the cell.

According to the back contact solar cell of the present disclosure, the hybrid back contact cell is formed by combining the passivation contact technology on a back surface of the semiconductor substrate, and the laser protection layer is formed outside the functional layer. Therefore, an excess laser can be absorbed in the laser film opening process to protect the film layer between the laser protection layer and the semiconductor substrate, and thermal attenuation of the heterojunction can be avoided to improve the open circuit voltage and the photoelectric conversion efficiency of the battery.

According to an embodiment of the present disclosure, the laser protection layer includes an insulation dielectric layer and a laser absorption layer. The insulation dielectric layer is formed on the side of the second functional layer away from the semiconductor substrate, and the insulation dielectric layer exposes the electrode contact region of the second functional layer. The laser absorption layer is formed on a side of the insulation dielectric layer away from the semiconductor substrate. A material of the laser absorption layer includes a laser absorption material.

According to an embodiment of the present disclosure, a material of the insulation dielectric layer includes at least one of silicon nitride, silicon nitride oxide, or silicon oxide; and the insulation dielectric layer has a thickness ranging from 10 nm to 100 nm.

According to an embodiment of the present disclosure, the material of the laser absorption layer includes at least one of amorphous silicon, nanocrystalline silicon, microcrystalline silicon, and polycrystalline silicon; and the laser absorption layer has a thickness ranging from 5 nm to 100 nm.

According to an embodiment of the present disclosure, the second functional layer at least partially extends into the first polarity region; and a first orthographic projection of the first functional layer on the semiconductor substrate at least partially overlaps with a second orthographic projection of the second functional layer on the semiconductor substrate.

A part of the first functional layer overlapping with a part of the second functional layer is in direct contact with the part of the second functional layer.

According to an embodiment of the present disclosure, in the first direction: the first electrode structure and the second electrode structure extend towards two sides; and an opening is formed between the first electrode structure and the second electrode structure adjacent to the first electrode structure, a third orthographic projection of the opening on the semiconductor substrate is located within an orthographic projection of the laser protection layer on the semiconductor substrate.

According to an embodiment of the present disclosure, the light-receiving surface is a textured surface; and each of a surface of the first polarity region and a surface of the second polarity region is a polished surface.

According to an embodiment of the present disclosure, a first distance between the surface of the first polarity region and the light-receiving surface is greater than a second distance between the surface of the second polarity region and the light-receiving surface. A difference between the first distance and the second distance ranges from 0.05 μm to 5 μm.

According to an embodiment of the present disclosure, the semiconductor substrate further includes a doped substrate layer. The doped substrate layer is located in the first polarity region and in contact with the first passivation layer. The doped substrate layer has a doping type same as the first doped semiconductor layer. The doped substrate layer has a thickness ranging from 5 nm to 200 nm.

According to an embodiment of the present disclosure, the electrode structure includes an electroconductive layer and an electrode. The electroconductive layer is arranged on a side of the doped semiconductor layer away from the passivation layer. The electrode is arranged on a side of the electroconductive layer away from the doped semiconductor layer.

A material of the electroconductive layer comprises at least one of zinc oxide, indium oxide, and tin oxide; the electroconductive layer is doped with at least one of gallium element, tin element, titanium element, zirconium element, molybdenum element, cerium element, fluorine element, tungsten element, and aluminum element; and the electroconductive layer has a thickness ranging from 10 nm to 120 nm.

According to an embodiment of the present disclosure, the first passivation layer includes tunneling oxide and has a thickness ranging from 0.5 nm to 2.5 nm; the first doped semiconductor layer includes doped polysilicon and has a thickness ranging from 10 nm to 250 nm; the second passivation layer includes intrinsic amorphous silicon and has a thickness ranging from 1 nm to 15 nm; and the second doped semiconductor layer includes doped amorphous silicon and/or microcrystalline silicon and has a thickness ranging from 1 nm to 60 nm.

According to an embodiment of the present disclosure, the back contact solar cell further includes a third functional layer and an anti-reflection layer located on the light-receiving surface of the semiconductor substrate and stacked in a direction away from the semiconductor substrate. The third functional layer includes at least one of intrinsic amorphous silicon, a composite layer of the intrinsic amorphous silicon and doped thin film silicon, silicon oxide, a stacked layer of the silicon oxide and doped polysilicon laminated, silicon nitride, silicon nitride oxide, and aluminum oxide; and the anti-reflection layer includes at least one of silicon oxide, silicon nitride, silicon nitride oxide, aluminum oxide, transparent electroconductive oxide, and magnesium fluoride.

According to the method of the present disclosure, the hybrid back contact cell is formed by combining the passivation contact technology on a back surface of the semiconductor substrate, and the laser protection layer is formed outside the functional layer. Therefore, an excess laser can be absorbed in the laser film opening process to protect the film layer between the laser protection layer and the semiconductor substrate, and thermal attenuation of the heterojunction can be avoided to improve the open circuit voltage and the photoelectric conversion efficiency of the battery.

According to an embodiment of the present disclosure, the forming the laser protection layer on the side of the second functional layer away from the semiconductor substrate includes: forming an insulation dielectric layer on the side of the second functional layer away from the semiconductor substrate; and forming a laser absorption layer on a side of the insulation dielectric layer away from the semiconductor substrate. A material of the laser absorption layer includes a laser absorption material.

According to an embodiment of the present disclosure, the first functional layer is covered by the formed second functional layer; and the removing the part of the film layer corresponding to the electrode contact region of the first functional layer on the side of the first functional layer away from the semiconductor substrate includes: removing, by laser ablation, a part of the laser absorption layer corresponding to the electrode contact region of the first functional layer, removing, by wet etching, a part of the insulation dielectric layer corresponding to the electrode contact region of the first functional layer, and removing, by laser ablation, a part of the second functional layer corresponding to the electrode contact region of the first functional layer; or removing, by laser ablation, the part of the laser absorption layer, the part of the insulation dielectric layer, and the part of the second functional layer that correspond to the electrode contact region of the first functional layer.

According to an embodiment of the present disclosure, a first orthographic projection of the first functional layer on the semiconductor substrate at least partially overlaps with a second orthographic projection of the second functional layer on the semiconductor substrate; and the forming the electrode structure in each of the electrode contact region of the first functional layer and the electrode contact region of the second functional layer includes: forming an electroconductive layer on each of the side of the first functional layer away from the semiconductor substrate and the side of the second functional layer away from the semiconductor substrate; forming, by laser ablation, an opening on the laser protection layer within an orthographic projection of the laser protection layer on the semiconductor substrate, the opening at least cutting off the electroconductive layer and at most exposing the first functional layer; and forming an electrode on each of a side, away from the semiconductor substrate, of a contact portion between the electroconductive layer and the electrode contact region of the first functional layer and a side, away from the semiconductor substrate, of a contact portion between the electroconductive layer and the electrode contact region of the second functional layer.

According to an embodiment of the present disclosure, the removing the part of the film layer corresponding to the electrode contact region of the second functional layer on the side of the second functional layer away from the semiconductor substrate includes: removing, by laser ablation, a part of the laser absorption layer corresponding to the electrode contact region of the second functional layer; and removing, by wet etching, a part of the insulation dielectric layer corresponding to the electrode contact region of the second functional layer.

According to an embodiment of the present disclosure, subsequent to the providing the semiconductor substrate, the method further includes performing treatment on a surface of the semiconductor substrate to enable the light-receiving surface to be formed as a textured surface, and each of a surface of the first polarity region and a surface of the second polarity region to be formed as polished surface.

According to an embodiment of the present disclosure, the performing treatment on the surface of the semiconductor substrate includes texturing the light-receiving surface and the shady surface of the semiconductor substrate; forming a first mask on the light-receiving surface of the semiconductor substrate; polishing the shady surface of the semiconductor substrate; and removing the first mask.

According to an embodiment of the present disclosure, prior to the performing treatment on the surface of the semiconductor substrate, the method further includes performing gettering treatment on the semiconductor substrate.

According to an embodiment of the present disclosure, the performing the gettering treatment on the semiconductor substrate includes removing, by wet etching, a sacrificial layer of the semiconductor substrate; performing, by high-temperature phosphorus diffusion, the gettering treatment on the semiconductor substrate; and removing, by wet etching, a gettering-treated layer of the semiconductor substrate formed during the gettering treatment.

According to an embodiment of the present disclosure, the forming the first functional layer in the first polarity region includes: sequentially forming a doped substrate layer, the first functional layer, and a second mask on the shady surface of the semiconductor substrate; removing a part of the doped substrate layer corresponding to the second polarity region of the semiconductor substrate and a part of the first functional layer corresponding to the second polarity region of the semiconductor substrate; and removing the second mask.

Referring to FIG. 1, FIG. 1 shows a cross-sectional structure of a back contact solar cell. An embodiment of the present disclosure proposes a back contact solar cell.

In this implementation, the back contact solar cell includes a semiconductor substrate 1, a first functional layer 2, a second functional layer 4, a laser protection layer, a first electrode structure, and a second electrode structure. The semiconductor substrate 1 has a light-receiving surface and a shady surface that are opposite to each other. The shady surface includes a first polarity region A and a second polarity region B that are arranged alternately in a first direction D1. The first functional layer 2 is formed in the first polarity region A. The first functional layer 2 includes a first passivation layer 2-1 and a first doped semiconductor layer 2-2 that are stacked in a direction away from the semiconductor substrate 1. The second functional layer 4 is formed in the second polarity region B. The second functional layer 4 includes a second passivation layer 4-1 and a second doped semiconductor layer 4-2 that are stacked in the direction away from the semiconductor substrate 1. The first doped semiconductor layer 2-1 has a doping type opposite to a doping type of the second doped semiconductor layer 4-2. The laser protection layer is formed on a side of the second functional layer 4 away from the semiconductor substrate 1, and the laser protection layer exposes an electrode contact region of the second functional layer 4. A material of the laser protection layer includes a laser absorption material. The first electrode structure is formed on a side of the first functional layer 2 away from the semiconductor substrate 1. The second electrode structure is formed on a side of the second functional layer 4 away from the semiconductor substrate 1, and the second electrode structure is located in the electrode contact region.

In some embodiments, the semiconductor substrate 1 may include a material such as single crystal silicon, germanium, or gallium arsenide. A doping type of the semiconductor substrate 1 may be an N-type doping or a P-type doping.

As illustrated in FIG. 1, the first polarity region A is in contact with the second polarity region B in the first direction D1. A first opening G1 is formed on the shady surface of the semiconductor substrate 1. The first opening G1 is configured to be formed as the second polarity region B. A surface of the first polarity region A is represented as a first surface S1. A surface of the second polarity region B is represented as a second surface S2. The light-receiving surface of the semiconductor substrate 1 is represented as a third surface S3.

In the preparation process, the second passivation layer 4-1 and the second doped semiconductor layer 4-2 were usually formed by a film forming process. Therefore, the first functional layer 4 formed initially covered the first functional layer 2, and then the second functional layer 4 was patterned. In order to save the process flow, the second functional layer 4 was patterned by laser ablation. Before the second functional layer 4 was patterned, the laser protection layer was also formed on the side of the second functional layer 4 away from the semiconductor substrate 1 in this implementation. Therefore, when the laser ablation was performed on the second functional layer 4, a part of the laser protection layer corresponding to a part of the second functional layer 4 that needed to be removed is first removed, and a remaining part of the laser protection layer covered a part of the second functional layer 4 other than an electrode contact region of the second functional layer 4. Then, the laser ablation was performed on the second functional layer 4. In this way, damage to the part of the second functional layer 4 that did not need to be removed can be avoided.

It is to be understood that forming the laser protection layer outside the functional layer can absorb an excess laser in the laser film opening process to protect the film layer between the laser protection layer and the semiconductor substrate and avoid thermal attenuation of the heterojunction to improve the open circuit voltage and the photoelectric conversion efficiency of the battery. In addition, since the part of the laser protection layer covering the part of the second functional layer 4 other than the electrode contact region of the second functional layer 4 is retained, the part of laser protection layer can also provide a function in isolating water vapor. In this way, the moisture and heat resistance of the back contact solar cell is improved.

In some embodiments, the laser protection layer includes an insulation dielectric layer 5 and a laser absorption layer 6. The insulation dielectric layer 5 is formed on the side of the second functional layer 4 away from the semiconductor substrate 1 and exposes the electrode contact region of the second functional layer 4. The laser absorption layer 6 is formed on a side of the insulation dielectric layer 5 away from the semiconductor substrate 1. A material of the laser absorption layer 6 includes a laser absorption material.

The laser protection layer is formed with a second opening G2 on the side of the second functional layer 4 away from the semiconductor substrate 1, and a part of the second functional layer 4 exposed by the second opening G2 serves as the electrode contact region. The second electrode structure is in contact with the electrode contact region to collect carriers in the second functional layer 4.

In this implementation, the laser protection layer is of a double-layer structure. The insulation dielectric layer 5 is configured to separate the laser absorption layer 6 from the second functional layer 4 to further protect the second functional layer 4.

It should be noted that the insulation dielectric layer 5 has better moisture and heat resistance than the conductive layer 9. Therefore, the insulation dielectric layer 5 can also provide a function in isolating water vapor to improve the moisture and heat resistance of the back contact solar cell. In this way, the reliability is higher.

In some embodiments, a material of the insulation dielectric layer includes at least one of silicon nitride, silicon nitride oxide, or silicon oxide. The insulation dielectric layer has a thickness ranging from 10 nm to 100 nm. For example, the insulation dielectric layer 5 may have a thickness of 10 nm, 50 nm, or 100 nm, etc.

In some embodiments, the material of the laser absorption layer includes at least one of amorphous silicon, nanocrystalline silicon, microcrystalline silicon, and polycrystalline silicon. The laser absorption layer has a thickness ranging from 5 nm to 100 nm. For example, the laser absorption layer 6 may have a thickness of 5 nm, 50 nm or 100 nm, etc.

In some embodiments, the first surface S1 and the second surface S2 are of a polished surface structure. For example, the first surface S1 and the second surface S2 may be polished surface morphologies subjected to polishing. The polishing processing may be performed by polishing with a conventional alkaline polishing solution.

Since the shady surface of the semiconductor substrate 1 is made into the polished surface, an interface area between the shady surface of the semiconductor substrate 1 and the polarity structure is reduced, thereby reducing the interface defects and the carrier recombination of the heterojunction region of the shady surface and improving the open circuit voltage and the photoelectric conversion efficiency of the back contact solar cell.

The third surface S3 is of a textured structure, such as a pyramidal textured morphology and/or a corrosion-pitted textured morphology.

In some embodiments of the present disclosure, a first distance between the surface of the first polarity region A and the light-receiving surface is greater than a second distance between the surface of the second polarity region B and the light-receiving surface. Therefore, the original film layer of the first polarity region A is easily ensured to be completely removed when the first opening G1 is formed.

A difference between the first distance and the second distance ranges from 0.05 μm to 5 μm. For example, a difference between the first distance and the second distance may be 0.05 μm, 1 μm or 5 μm, etc.

In some embodiments, the semiconductor substrate 1 further includes a doped substrate layer 3. The doped substrate layer 3 is located in the first polarity region A and is formed on a side close to the first passivation layer 2-1. The doped substrate layer 3 has a doping type same as a doping type of the first doped semiconductor layer 2-2.

A surface of the doped substrate layer 3 close to the first passivation layer 2-1 is a polished surface. The doped substrate layer 3 is formed by doping a part of the semiconductor substrate 1. For example, a part of the semiconductor substrate 1 in the first polarity region A is doped with particles such as boron to form a doped substrate layer 3 of a P-type; or it is doped with particles such as arsenic and phosphorus to form a doped substrate layer 3 of an N-type.

In some embodiments, the doped substrate layer 3 has a thickness ranging from 5 nm to 200 nm. For example, the doped substrate layer 3 may have a thickness of 5 nm, 50 nm, 100 nm or 200 nm.

In some embodiments, a material of the first passivation layer 2-1 may include tunneling oxide, and the first passivation layer 2-1 has a thickness ranging from 0.5 nm to 2.5nm. For example, the first passivation layer 2-1 may have a thickness of 0.5 nm, 1.5 nm or 2.5 nm, etc. Thus, a good passivation effect is achieved on the first surface S1, while ensuring a multi-carrier tunneling effect.

A surface of the first passivation layer 2-1 on a side of the first passivation layer 2-1 close to the semiconductor substrate 1 is also a polished surface. Thus, an interface area between the first passivation layer 2-1 and the semiconductor substrate 1 is reduced, thereby reducing a recombination probability of carriers at an interface between the first passivation layer 2-1 and the semiconductor substrate 1.

In some embodiments, a material of the first doped semiconductor layer 2-2 may include doped polysilicon, and the first doped semiconductor layer 2-2 may have a thickness ranging from 10 nm to 250 nm. For example, the first doped semiconductor layer 2-2 may have a thickness of 10 nm, 50 nm, 150 nm or 250 nm, etc. Thus, a field passivation effect is good, and the film layer thickness is small. In this way, parasitic absorption is reduced.

The first doped semiconductor layer 2-2 has a doping type same as or opposite to the doping type of the semiconductor substrate 1. For example, the semiconductor substrate 1 is of an N-type doping, and the first doped semiconductor layer 2-2 may be an N-type doping or a P-type doping.

In some embodiments, the second passivation layer 4-1 includes intrinsic amorphous silicon and has a thickness ranging from 1 nm to 15 nm. For example, the second passivation layer 4-1 may have a thickness of 1 nm, 10 nm or 15 nm, etc. Thus, a good passivation effect is achieved on the second surface S2.

A surface of the second passivation layer 4-1 on a side of the second passivation layer 4-1 close to the semiconductor substrate 1 is also a polished surface. Thus, an interface area between the second passivation layer 4-1 and the semiconductor substrate 1 is reduced, thereby reducing a recombination probability of carriers at an interface between the second passivation layer 4-1 and the semiconductor substrate 1.

In some embodiments, the second doped semiconductor layer 4-2 includes doped amorphous silicon and/or microcrystalline silicon and has a thickness ranging from 1 nm to 60 nm. For example, the second doped semiconductor layer 4-2 may have a thickness of 1 nm, 30 nm or 60 nm, etc. Thus, the field passivation effect is good, and the film layer thickness is small. In this way, the parasitic absorption is reduced.

The second doped semiconductor layer 4-2 has a doping type opposite to the doping type of the first doped semiconductor layer 2-2. For example, the first doped semiconductor layer 2-2 is an N-type doping, and the second doped semiconductor layer 4-2 may be a P-type doping.

In some embodiments, the second functional layer 4 at least partially extends into the first polarity region A, and a first orthographic projection of the first functional layer 2 on the semiconductor substrate 1 at least partially overlaps with a second orthographic projection of the second functional layer 4 on the semiconductor substrate 1. A part of the first functional layer 2 overlapping with a part of the second functional layer 4 is in direct contact with the part of the second functional layer 4.

In the first direction D1, the second passivation layer 4-1 and the second doped semiconductor layer 4-2 extend to the first polarity regions A on two sides, and partially overlap with the first passivation layer 2-1 and the first doped semiconductor layer 2-2 that are located in the first polarity regions A on the two sides, respectively. Orthographic projections of the overlapping parts on the semiconductor substrate 1 are located in the first polarity region A. Thus, in the first direction D1, the first polarity region A have the overlapping parts on two sides of the first polarity region A, respectively.

In the overlapping region, the first passivation layer 2-1, the first doped semiconductor layer 2-2, the second passivation layer 4-1, and the second doped semiconductor layer 4-2 are sequentially stacked in the direction away from the semiconductor substrate 1. When preparing the second functional layer 4, there is no mask on the part of the first functional layer 2 away from the semiconductor substrate 1 in the overlapping region. Thus, the problem of the mask suspended can be avoided to facilitate the preparation of the second functional layer 4, while a passivation quality at a junction of the first functional layer 2 and the second functional layer 4 is improved.

In some embodiments, the electrode structure includes an electroconductive layer 9 and an electrode. The electroconductive layer 9 is arranged on a side of the doped semiconductor layer away from the passivation layer. The electrode is arranged on a side of the electroconductive layer 9 away from the doped semiconductor layer.

The first electrode structure may have a P polarity, and the second electrode structure may have an N polarity. In some embodiments, the first electrode structure may have an N polarity, and the second electrode structure may have a P polarity. The polarity of the electrode structure depends on the doping type in the functional layer which the polarity is in contact with.

The first electrode structure includes a first electroconductive layer 9-1 and a first electrode 10. A third opening G3 is formed on a side of the first doped semiconductor layer 2-2 away from the first passivation layer 2-1. The first electroconductive layer 9-1 covers the third opening G3 and extends towards two sides of the third opening G3 in the first direction D1. The first electrode 10 is arranged on a side of the first electroconductive layer 9-1 away from the first doped semiconductor layer 2-2.

The part of the first electroconductive layer 9-1 extending from the third opening G3 and the first functional layer 2 may be spaced apart by a part of the second functional layer 4. That is, the first electroconductive layer 9-1 and the first doped semiconductor layer 2-2 are spaced apart by the second passivation layer 4-1, the second doped semiconductor layer 4-2, the insulation dielectric layer 5, and the laser absorption layer 6, or spaced apart by the second passivation layer 4-1 and the second doped semiconductor layer 4-2.

The second electrode structure includes a second electroconductive layer 9-2 and a second electrode 11. The second conductive layer 9-2 is formed on a side of the second doped semiconductor layer 4-2 away from the second passivation layer 4-1 and covers the second polarity region B. The second electrode 11 is arranged on a side of the second conductive layer 9-2 away from the second doped semiconductor layer 4-2.

In the first direction D1, two ends of the second conductive layer 9-2 may at least partially extend to the first polarity region A, and an orthographic projection of the second conductive layer 9-2 on the semiconductor substrate 1 at least partially overlaps with a second orthographic projection of the second functional layer 4 on the semiconductor substrate 1. The second conductive layer 9-2 and the first doped semiconductor layer 2-2 are spaced apart by the second passivation layer 4-1, the second doped semiconductor layer 4-2, the insulation dielectric layer 5, and the laser absorption layer 6, or spaced apart by the second passivation layer 4-1 and the second doped semiconductor layer 4-2.

In some embodiments, the first electroconductive layer 9-1 and the second conductive layer 9-2 include transparent electroconductive oxide. For example, a material of the first electroconductive layer 9-1 and the second conductive layer 9-2 include at least one of zinc oxide, indium oxide, and tin oxide. A material of the first electrode 10 and the second electrode 11 may be a metal material, such as silver or copper.

In some embodiments, the first electroconductive layer 9-1 and the second conductive layer 9-2 may be doped with at least one of gallium, tin, titanium, zirconium, molybdenum, cerium, fluorine, tungsten and aluminum.

In some embodiments, the first electroconductive layer 9-1 has a thickness same as a thickness of the second conductive layer 9-2, ranging from 10 nm to 120 nm. For example, the conductive layer 9 may have a thickness of 10 nm, 50 nm or 120 nm, etc.

In some embodiments, a fourth opening G4 is formed between the first electrode structure and the second electrode structure adjacent to the first electrode structure, and a third orthographic projection of the fourth opening G4 on the semiconductor substrate 1 is located within an orthographic projection of the laser protection layer on the semiconductor substrate 1. The first electrode structure and the second electrode structure are isolated by the fourth opening G4 to avoid a short circuit.

The fourth opening G4 is located between each second opening G2 and each third opening G3, and an orthographic projection, on the semiconductor substrate 1, of the fourth opening G4 located on each opening G2 and each opening G3 may be located at the first polarity region A, the second polarity region B, or a junction of the first polarity region A and the second polarity region B. At least the first electroconductive layer 9-1 and the second conductive layer 9-2 are spaced apart by the fourth opening G4, and the fourth opening G4 at most exposes the first functional layer 2. As illustrated in FIG. 1, the first electroconductive layer 9-1 and the second conductive layer 9-2 are spaced apart by the fourth opening G4, and the fourth opening G4 cuts off the second passivation layer 4-1 and the second doped semiconductor layer 4-2, and exposes the insulation dielectric layer 5 or exposes the first doped semiconductor layer 2-2.

In some embodiments, the back contact solar cell further includes a third functional layer 7 and an anti-reflection layer 8 located on the light-receiving surface of the semiconductor substrate 1. The third functional layer 7 is in contact with the light-receiving surface of the semiconductor substrate 1. The anti-reflection layer 8 is located on a side of the third functional layer 7 away from the semiconductor substrate 1, and the anti-reflection layer 8 is in contact with the third functional layer 7. The light-receiving surface of the semiconductor substrate 1 is a textured surface, and a surface of the third functional layer 7 close to the semiconductor substrate 1 is also a textured surface.

The third functional layer 7 includes at least one of intrinsic amorphous silicon, a composite layer of the intrinsic amorphous silicon and doped thin film silicon, silicon oxide, silicon nitride, silicon nitride oxide, and aluminum oxide. The anti-reflection layer 8 includes at least one of silicon oxide, silicon nitride, silicon nitride oxide, aluminum oxide, and transparent electroconductive oxide.

Referring to FIG. 2, FIG. 2 shows a process flow of preparing a back contact solar cell. An embodiment of the present disclosure also proposes a method for preparing a back contact solar cell.

In this implementation, a method for preparing a back contact solar cell includes operations at steps 10, 20, 30, 40, 50, and 60.

At step 10, a semiconductor substrate 1 is provided. The semiconductor substrate 1 has a light-receiving surface and a shady surface that are opposite to each other. The shady surface includes a first polarity region A and a second polarity region B arranged alternately in a first direction.

At step 20, a first functional layer 2 is formed in the first polarity region A. The first functional layer includes a first passivation layer 2-1 and a first doped semiconductor layer 2-2 that are stacked in a direction away from the semiconductor substrate 1.

At step 30, a second functional layer 4 is formed in the second polarity region B. The second functional layer 4 includes a second passivation layer 4-1 and a second doped semiconductor layer 4-2 that are stacked in a direction away from the semiconductor substrate 1. The first doped semiconductor layer 2-2 has a doping type opposite to a doping type of the second doped semiconductor layer 4-2.

At step 40, a laser protection layer is formed on a side of the second functional layer 4 away from the semiconductor substrate 1. A material of the laser protection layer includes a laser absorption material.

At step 50, a part of a film layer corresponding to an electrode contact region of the first functional layer 2 on a side of the first functional layer 2 away from the semiconductor substrate 1 and a part of a film layer corresponding to an electrode contact region of the second functional layer 4 on the side of the second functional layer 4 away from the semiconductor substrate 1 are removed to expose the electrode contact regions.

At step 60, an electrode structure is formed in each of the electrode contact region of the first functional layer 2 and the electrode contact region of the second functional layer 4.

In this implementation, the structure of the back contact solar cell prepared according to the method may refer to the above-mentioned embodiments. Forming the laser protection layer outside the second functional layer 4 can absorb the excess laser in the laser film opening process to protect the second functional layer 4 between the laser protection layer and the semiconductor substrate 1 and avoid the thermal attenuation of the heterojunction to improve the open circuit voltage and the photoelectric conversion efficiency of the battery.

Referring to FIGS. 3 to 11, FIGS. 3 to 11 show a cross-sectional structure of a cell at each stage in a process flow of preparing the cell to specifically illustrate an implementation of a method for preparing a back contact solar cell according to the present disclosure.

As illustrated in FIG. 3, in some embodiments, subsequent to the operation at step 10, the method may also include: performing treatment on a surface of the semiconductor substrate 1 to enable the light-receiving surface to be formed as a textured surface, and each of a surface of the first polarity region A and a surface of the second polarity region B to be formed as a polished surface.

In this implementation, the treatment is first performed on morphologies of the light-receiving surface and the shady surface of the semiconductor substrate 1 to enable the light-receiving surface to be formed as the textured structure such as a pyramid texture morphology and/or a pyramidal textured morphology and/or a corrosion-pitted textured morphology, and the shady surface to be formed as the polished surface such as a polished morphology subjected to the polishing; then, the film layer structures are generated on the semiconductor substrate 1 to form a hybrid back contact solar cell. Thus, the interface defects and the carrier recombination of the heterojunction region on the shady surface are reduced. As a result, the solar cell has a high open circuit voltage and high photoelectric conversion efficiency while simplifying the process flow of the method to facilitate the large-scale mass production.

The semiconductor substrate 1 may include a material such as single crystal silicon, germanium or gallium arsenide. A doping type of the semiconductor substrate 1 may be an N-type doping or a P-type doping.

As an example, a specific flow of the performing treatment on the surface of the semiconductor substrate 1 may be as follows: the light-receiving surface and the shady surface of the semiconductor substrate 1 are first textured; a first mask M1 is then formed on the light-receiving surface of the semiconductor substrate 1; then, the shady surface of the semiconductor substrate 1 is polished; and finally, the first mask M1 is removed.

The semiconductor substrate 1 is immersed into a texturing solution to achieve the bifacial texturing of the light-receiving surface and the shady surface; then, the mask M1 is prepared on the light-receiving surface to protect the textured morphology of the light-receiving surface in the subsequent polishing process. The material of the mask M1 may include at least one of silicon oxide, silicon nitride, and silicon oxynitride.

The semiconductor substrate 1 with the prepared mask M1 is immersed into an alkaline polishing solution to polish the shady surface of the semiconductor substrate 1 to enable the shady surface to be formed into the polished surface morphology. The mask M1 has a predetermined thickness remained after the shady surface of the semiconductor substrate 1 is polished to ensure the textured morphology of the light-receiving surface of the semiconductor substrate 1. The thickness of the remaining part of the mask M1 may range from 10 nm to 100 nm, such as 10 nm, 50 nm or 100 nm.

In some embodiments, the operation of the step of removing the mask M1 may be performed in the subsequent step of preparing the first functional layer 2, that is, after polishing the shady surface of the semiconductor substrate 1, the first mask M1 is retained and the operation of step 20 is performed.

In some embodiments, prior to the performing treatment on the surface of the semiconductor substrate 1, the method further includes: performing gettering treatment on the semiconductor substrate 1. Performing the gettering treatment on the semiconductor substrate 1 can reduce a content of impurity elements in the semiconductor substrate 1, thereby reducing the carrier recombination.

As an example, a process flow of the performing the gettering treatment on the semiconductor substrate 1 may include: removing, by wet etching, a sacrificial layer of the semiconductor substrate 1; performing, by high-temperature phosphorus diffusion, the gettering treatment on the semiconductor substrate 1; and removing, by wet etching, a gettering-treated layer of the semiconductor substrate 1 formed during the gettering treatment. Thus, the content of impurity elements inside the semiconductor substrate 1 can be effectively reduced.

In some embodiments, a specific process flow of the forming the first functional layer 2 in the first polarity region A include: sequentially forming a doped substrate layer 3, the first functional layer 2, and a second mask M2 on the shady surface of the semiconductor substrate 1; removing a part of the doped substrate layer 3 and a part of the first functional layer 3 from corresponding to the second polarity region B of the semiconductor substrate 1; and removing the second mask M2.

Figure 4:
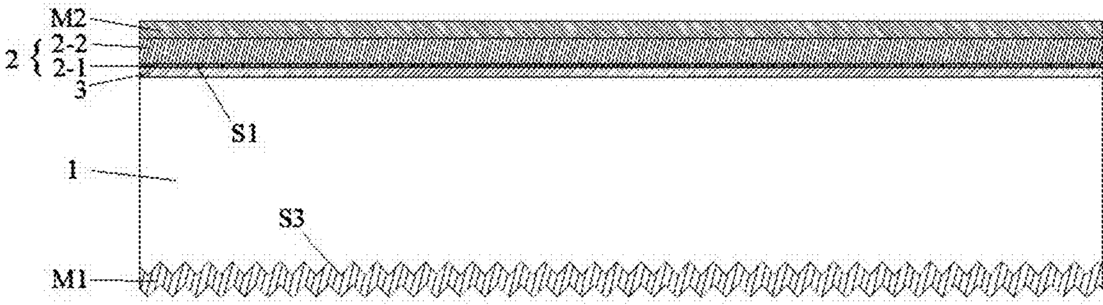
FIG. 4 is a cross-sectional structural view at a second stage of the method for preparing the back contact solar cell according to an embodiment of the present disclosure.

Referring to FIG. 4, the first passivation layer 2-1 and the first doped semiconductor layer 2-2 are prepared by Low Pressure Chemical Vapor Deposition (LPCVD) or Plasma Enhanced Chemical Vapor Deposition (PECVD). A material of the first passivation layer 2-1 may include tunneling oxide, and the first passivation layer 2-1 has a thickness ranging from 0.5 nm to 2.5 nm, such as 0.5 nm, 1.5 nm or 2.5 nm. A material of the first doped semiconductor layer 2-2 may include doped polysilicon, and the first doped semiconductor layer 2-2 has a thickness ranging from 10 nm to 250 nm, such as 10 nm, 50 nm, 150 nm or 250 nm. A method for doping the first doped semiconductor layer 2-2 includes: preparing in-situ doped amorphous/polycrystalline silicon, and performing high-temperature annealing and crystallization on the in-situ doped amorphous/polycrystalline silicon; or preparing an intrinsic amorphous/polycrystalline silicon layer, and performing high-temperature diffusion on the prepared intrinsic amorphous/polycrystalline silicon layer for doping and crystallization.

In this embodiment, while forming the first functional layer 2, a doped substrate layer 3 is formed by doping elements in the first doped semiconductor layer 2-2 entering the shady surface of the semiconductor substrate 1 through the first passivation layer 2-1. The doped substrate layer 3 has a doping type same as a doping type of the first doped semiconductor layer 2-2. The doped substrate layer 3 has a thickness ranging from 5 nm to 200 nm, such as 5 nm, 50 nm, 100 nm or 200 nm.

After the first functional layer 2 is formed, a second mask M2 is prepared on the first functional layer 2 on the side of the first functional layer 2 away from the semiconductor substrate 1. A material of the second mask M2 includes phosphosilicate glass or at least one of borosilicate glass, silicon oxide, silicon nitride or silicon oxynitride.

Figure 5:
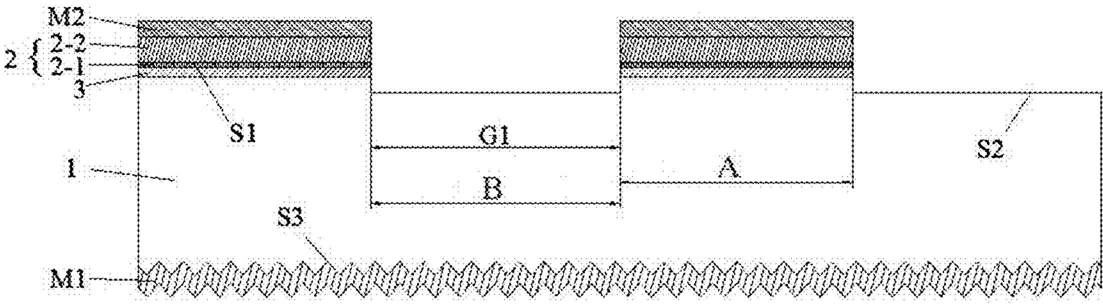
FIG. 5 is a cross-sectional structural view at a third stage of the method for preparing the back contact solar cell according to an embodiment of the present disclosure.

As illustrated in FIG. 5, a first opening G1 is formed by removing a part of the doped substrate layer 3 corresponding to the second polarity region B, a part of the first functional layer 2 corresponding to the second polarity region B, and a part of the second mask M2 corresponding to the second polarity region B of the semiconductor substrate 1 at a side of the second polarity region B of the semiconductor substrate 1 away from the semiconductor substrate 1. The first opening G1 exposes a second surface S2. A distance between a first surface S1 and a third surface S3 is greater than a distance between the second surface S2 and the third surface S3. Removing a predetermined thickness of the semiconductor substrate 1 can ensure no residue of the doped substrate layer 3.

As an example, a part of the second mask M2 may be removed by laser etching, ink printing, etc.; then a part of the first doped semiconductor layer 2-2, a part of the first passivation layer 2-1, and a part of the doped substrate layer 3 are removed in a region other than the second mask M2 by wet chemical etching. The wet chemical etching further includes synchronously removing a part of the first functional layer 2 deposited on the front surface of the first functional layer 2 or plated around an edge of the front surface of the first functional layer 2 to expose the first mask M1.

In some embodiments, a wet chemical etching solution used in the wet chemical etching includes an alkaline polishing solution. Thus, the second surface S2 can be polished to form a polished surface while removing the part of the doped substrate layer 3 to reduce surface defects.

Figure 6:
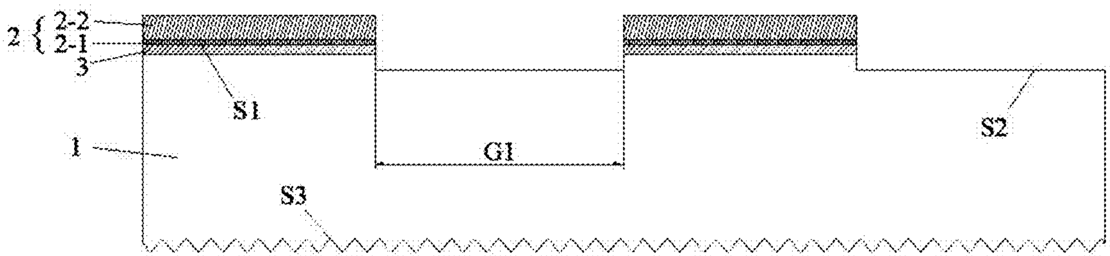
FIG. 6 is a cross-sectional structural view at a fourth stage of the method for preparing the back contact solar cell according to an embodiment of the present disclosure.

As illustrated in FIG. 6, the first mask MI is removed to expose the third surface S3. The second mask M2 is simultaneously removed to expose the first doped semiconductor layer 2-2. The first mask M1 and the second M2 may be removed by etching with a wet chemical method, and a chemical solution may include hydrofluoric acid.

Figure 7:
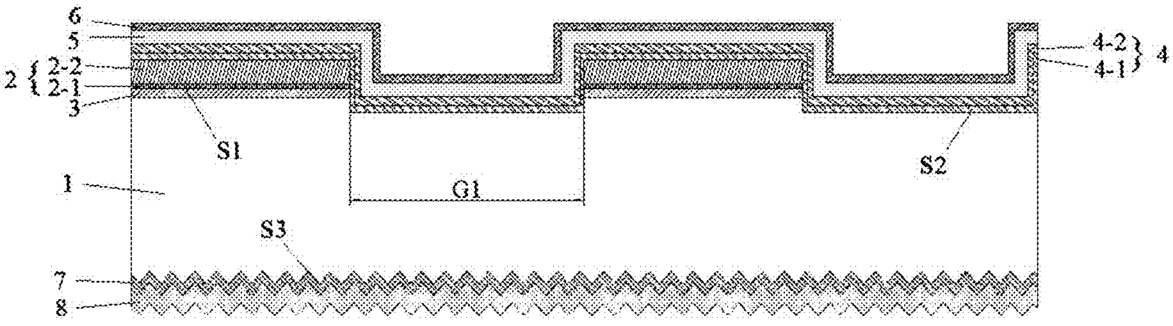
FIG. 7 is a cross-sectional structural view at a fifth stage of the method for preparing the back contact solar cell according to an embodiment of the present disclosure.

As illustrated in FIG. 7, a second functional layer 4 is formed on the shady surface of the semiconductor substrate 1, and the second functional layer 4 covers the first functional layer 2. The second passivation layer 4-1 and the second doped semiconductor layer 4-2 are prepared on the shady surface of the semiconductor substrate 1 by LPCVD or PECVD. The second passivation layer 4-1 includes intrinsic amorphous silicon and has a thickness ranging from 1 nm to 15 nm, such as 1 nm, 10 nm or 15 nm. The second doped semiconductor layer 4-2 includes doped amorphous silicon and/or microcrystalline silicon and has a thickness ranging from 1 nm to 60 nm, such as 1 nm, 30 nm or 60 nm. The second doped semiconductor layer 4-2 has a doping type opposite to the doping type of the first doped semiconductor layer 2-2.

In some embodiments, subsequent to the forming the second functional layer 4 on the shady surface of the semiconductor substrate 1, the method may further include: sequentially forming a third functional layer 7 and an anti-reflection layer 8 on the light-receiving surface of the semiconductor substrate 1. The third functional layer 7 and the anti-reflection layer 8 may also be formed by LPCVD or PECVD. The third functional layer 7 includes at least one of intrinsic amorphous silicon, a composite layer of the intrinsic amorphous silicon and doped thin film silicon, silicon oxide, silicon nitride, silicon nitride oxide or aluminum oxide. The anti-reflection layer 8 includes at least one of silicon oxide, silicon nitride, silicon nitride oxide, aluminum oxide or transparent electroconductive oxide.

In some embodiments, the operation of the forming the laser protection layer on the side of the second functional layer 4 away from the semiconductor substrate 1 includes: forming an insulation dielectric layer 5 on the side of the second functional layer 4 away from the semiconductor substrate 1; and forming a laser absorption layer 6 on a side of the insulation dielectric layer 5 away from the semiconductor substrate 1. The laser absorption layer 6 includes a laser absorption material.

The laser protection layer is of a double-layer structure. The laser absorption layer 6 and the second functional layer 4 are spaced apart by the insulation dielectric layer 5 to further protect the second functional layer 4. It should be noted that the insulation dielectric layer 5 has better moisture and heat resistance than the conductive layer 9. Therefore, the insulation dielectric layer 5 can also provide a function in isolating water vapor to improve the moisture and heat resistance of the back contact solar cell. In this way, the reliability is higher.

Figure 8:
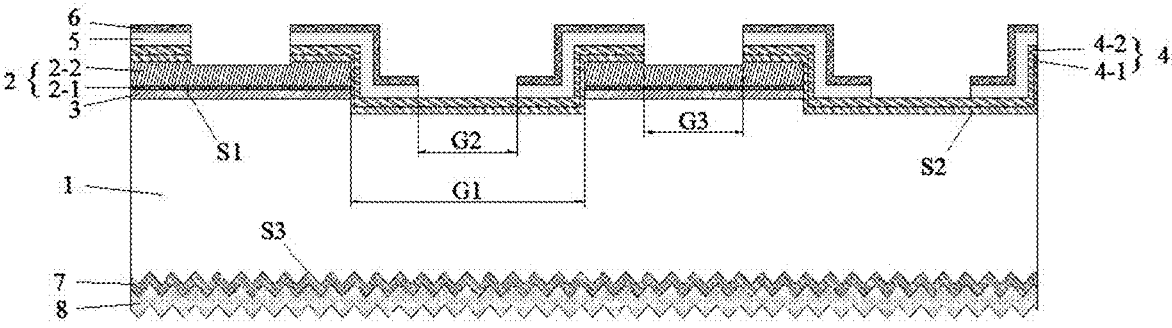
FIG. 8 is a cross-sectional structural view at a sixth stage of the method for preparing the back contact solar cell according to an embodiment of the present disclosure.

As illustrated in FIG. 8, the second opening G2 and the third opening G3 are prepared to expose an electrode contact region of the first functional layer 2 and an electrode contact region of the second functional layer 4.

As an example, a specific process flow of the removing the part of the film layer corresponding to the electrode contact region of the second functional layer 4 on the side of the second functional layer 4 away from the semiconductor substrate 1 includes: removing, by laser ablation, a part of the laser absorption layer 6 corresponding to the electrode contact region of the second functional layer 4; and removing, by wet etching, a part of the insulation dielectric layer 5 corresponding to the electrode contact region of the second functional layer 4.

In this embodiment, removing the insulation dielectric layer 5 by the wet etching can reduce the damage of the laser to the second functional layer 4 compared with directly removing the laser absorption layer 6 and the insulation dielectric layer 5 by the laser ablation.

As an example, a specific process flow of the removing the part of the film layer corresponding to the electrode contact region of the first functional layer on the side of the first functional layer away from the semiconductor substrate includes: removing, by laser ablation, a part of the laser absorption layer 6 corresponding to the electrode contact region of the first functional layer 2; removing, by wet etching, a part of the insulation dielectric layer 5 corresponding to the electrode contact region of the first functional layer 2; and removing, by laser ablation, a part of the second functional layer 4 corresponding to the electrode contact region of the first functional layer 2. Removing the insulation dielectric layer 5 by the wet etching can reduce the damage of the laser to the second functional layer 4.

In another example, a part of the laser absorption layer 6, a part of the insulation dielectric layer 5, a part of the second doped semiconductor layer 4-2, and a part of the second passivation layer 4-1 that correspond to the electrode contact region of the first functional layer 2 are removed by laser ablation to expose the first doped semiconductor layer 2-2 and form a third opening G3.

At step 50, after the wet etching, a remaining part of the anti-reflection layer 8 has a thickness ranging from 20 nm to 120 nm after being thinned. For example, a remaining part of the anti-reflection layer 8 may have a thickness of 20 nm, 70 nm or 120 nm, etc.

After the operation of step 50, a second orthographic projection of a remaining part of the second functional layer 4 on the semiconductor substrate 1 at least partially overlaps with a first orthographic projection of the first functional layer 2 on the semiconductor substrate 1. In the overlapping region, the first passivation layer 2-1, the first doped semiconductor layer 2-2, the second passivation layer 4-1, and the second doped semiconductor layer 4-2 are sequentially stacked in the direction away from the semiconductor substrate 1.

In some embodiments, a specific process of step 60 may include: forming an electroconductive layer 9 on each of the side of the first functional layer 2 away from the semiconductor substrate 1 and the side of the second functional layer 4 away from the semiconductor substrate 1; forming, by laser ablation, a fourth opening G4 in an overlapping region of the first orthographic projection and the second orthographic projection, the fourth opening G4 at least cutting off the electroconductive layer 9 and at most exposing the first functional layer 2; and forming an electrode on each of a side, away from the semiconductor substrate 1, of a contact portion between the electroconductive layer 9 and the electrode contact region of the first functional layer 2 and a side, away from the semiconductor substrate 1, of a contact portion between the electroconductive layer 9 and the electrode contact region of the second functional layer 4.

Figure 9:
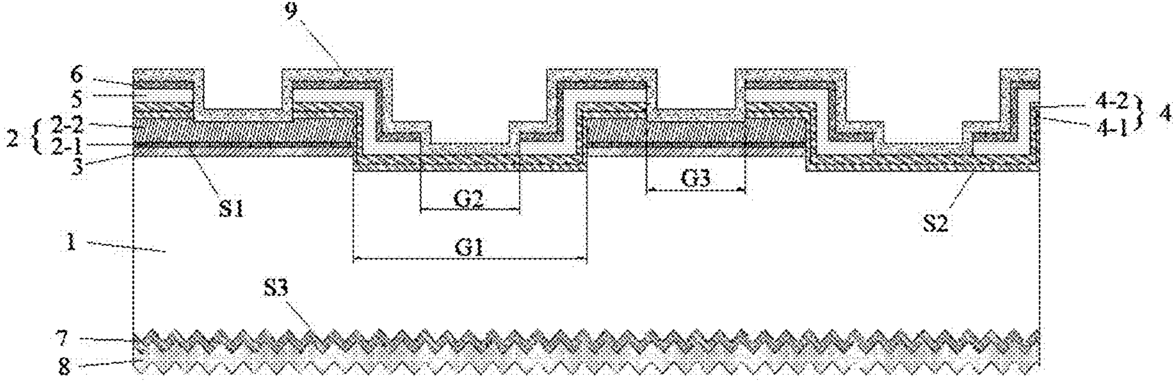
FIG. 9 is a cross-sectional structural view at a ninth stage of the method for preparing the back contact solar cell according to an embodiment of the present disclosure.

As illustrated in FIG. 9, an electroconductive layer 9 is formed on each of the side of the first functional layer 2 away from the semiconductor substrate 1 and the second functional layer 4 away from the semiconductor substrate 1. The electroconductive layer 9 may be prepared by physical vapor deposition (PVD) and chemical vapor deposition (CVD), and may be selected from reactive plasma deposition (RPD), magnetron sputtering, pulsed laser deposition (PLD), vacuum evaporation, atomic layer deposition (ALD), etc. A material of the electroconductive layer 9 may include at least one of zinc oxide, indium oxide, and tin oxide. The electroconductive layer 9 is doped with at least one of gallium element, tin element, titanium element, zirconium element, molybdenum element, cerium element, fluorine element, tungsten element, and aluminum element. The electroconductive layer 9 has a thickness ranging from 10 nm to 120 nm, such as 10 nm, 50 nm or 150 nm.

Figure 10:
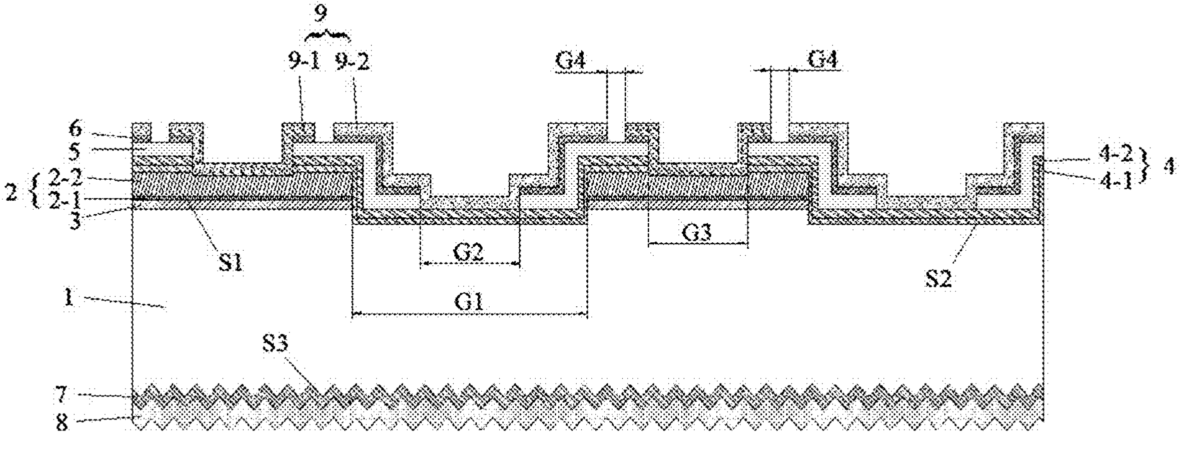
FIG. 10 is a cross-sectional structural view at an eighth stage of the method for preparing the back contact solar cell according to an embodiment of the present disclosure.

As illustrated in FIG. 10, a fourth opening G4 is prepared by etching an overlapping region between with the first functional layer 2 and the second functional layer 4 by laser etching, ink printing and/or a wet chemical method. The fourth opening G4 is located between each second opening G2 and each third opening G3. The fourth opening G4 at least completely cuts off the electroconductive layer 9 to expose the laser absorption layer 6, and at most exposes the first doped semiconductor layer 2-2. The conductive layer 9 is divided into two parts by the fourth opening G4, including the first electroconductive layer 9-1 covering the third opening G3 and the second conductive layer 9-2 covering the second opening G2, respectively.

In some embodiments, the fourth opening G4 exposes the insulation dielectric layer 5.

Figure 11:
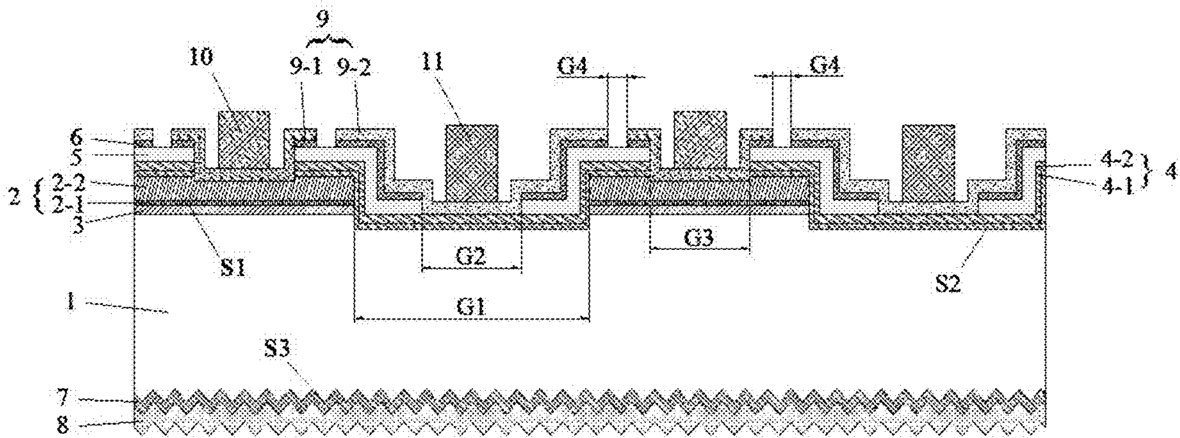
FIG. 11 is a cross-sectional structural view at a ninth stage of the method for preparing the back contact solar cell according to an embodiment of the present disclosure.

As illustrated in FIG. 11, a first electrode 10 and a second electrode 11 are prepared by screen printing, inkjet printing or electroplating. The first electrode 10 is located on a side of the first electroconductive layer 9-1 away from the semiconductor substrate 1. The second electrode 11 is located on a side of the second electroconductive layer 9-2 away from the semiconductor substrate 1.

An embodiment of the present disclosure also provides a battery assembly. The battery assembly includes the above-mentioned back contact solar cell, or includes a back contact solar cell prepared according to the above-mentioned method. A specific structure and principle of the back contact solar cell, as well as the specific steps of the method for preparing same, may refer to the above-mentioned embodiments, and this implementation will not be repeated herein. The battery assembly according to the present disclosure has a high open circuit voltage and photoelectric conversion efficiency.

In the present disclosure, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a," does not exclude the presence of additional identical elements in the process, method, article or device that comprises the said element. In addition, it should be noted that the scope of the methods and devices in the embodiments of the present disclosure is not limited to performing functions in the order shown or discussed, but may also include performing functions in a substantially simultaneous manner or in reverse order according to the functions involved. For example, the described methods may be performed in an order different from that described, and various steps may be added, omitted, or combined. In addition, features described with reference to certain examples may be combined in other examples.

Although embodiments of the present disclosure have been illustrated and described, it is conceivable for those of ordinary skill in the art that various changes, modifications, replacements, and variations can be made to these embodiments without departing from the principles and spirit of the present disclosure. The scope of the present disclosure shall be defined by the claims as appended and their equivalents.

What is claimed is:

1. A back contact solar cell, comprising:

a semiconductor substrate having a light receiving surface and a shady surface that are opposite to each other, the shady surface comprising a first polarity region and a second polarity region that are arranged alternately in a first direction;

a first functional layer formed in the first polarity region, the first functional layer comprising a first passivation layer and a first doped semiconductor layer that are stacked in a direction away from the semiconductor substrate;

a second functional layer formed in the second polarity region, the second functional layer comprising a second passivation layer and a second doped semiconductor layer that are stacked in the direction away from the semiconductor substrate, the first doped semiconductor layer having a doping type opposite to a doping type of the second doped semiconductor layer;

a laser protection layer formed on a side of the second functional layer away from the semiconductor substrate, the laser protection layer exposing an electrode contact region of the second functional layer, and a material of the laser protection layer comprising a laser absorption material;

a first electrode structure formed on a side of the first functional layer away from the semiconductor substrate; and a second electrode structure formed on the side of the second functional layer away from the semiconductor substrate and located in the electrode contact region, wherein the semiconductor substrate further comprises a doped substrate layer located in the first polarity region and in direct contact with the first passivation layer, the doped substrate layer having a same doping type as the first doped semiconductor layer, wherein a surface of the doped substrate layer close to the first passivation layer is a polished surface, and the doped substrate layer is in direct contact with the second passivation layer formed in the second polarity region in the first direction.

2. The back contact solar cell according to claim 1, wherein the laser protection layer comprises:

an insulation dielectric layer formed on the side of the second functional layer away from the semiconductor substrate, the insulation dielectric layer exposing the electrode contact region of the second functional layer; and a laser absorption layer formed on a side of the insulation dielectric layer away from the semiconductor substrate, a material of the laser absorption layer comprising a laser absorption material.

3. The back contact solar cell according to claim 2, wherein:

a material of the insulation dielectric layer comprises at least one of silicon nitride, silicon nitride oxide, or silicon oxide; and the insulation dielectric layer has a thickness ranging from 10 nm to 100 nm.

4. The back contact solar cell according to claim 2, wherein:

the material of the laser absorption layer comprises at least one of amorphous silicon, nanocrystalline silicon, microcrystalline silicon, and polycrystalline silicon; and the laser absorption layer has a thickness ranging from 5 nm to 100 nm.

5. The back contact solar cell according to claim 1, wherein:

the second functional layer at least partially extends into the first polarity region;

a first orthographic projection of the first functional layer on the semiconductor substrate at least partially overlaps with a second orthographic projection of the second functional layer on the semiconductor substrate; and a part of the first functional layer overlapping with a part of the second functional layer is in direct contact with the part of the second functional layer.

6. The back contact solar cell according to claim 1, wherein in the first direction:

the first electrode structure and the second electrode structure extend towards two sides; and an opening is formed between the first electrode structure and the second electrode structure adjacent to the first electrode structure, a third orthographic projection of the opening on the semiconductor substrate being located within an orthographic projection of the laser protection layer on the semiconductor substrate.

7. The back contact solar cell according to claim 1, wherein:

the light-receiving surface is a textured surface; and each of a surface of the first polarity region and a surface of the second polarity region is a polished surface.

8. The back contact solar cell according to claim 7, wherein a first distance between the surface of the first polarity region and the light-receiving surface is greater than a second distance between the surface of the second polarity region and the light-receiving surface, a difference between the first distance and the second distance ranging from 0.05 μm to 5 μm.

9. The back contact solar cell according to claim 1, wherein the doped substrate layer has a thickness ranging from 5 nm to 200 nm.

10. The back contact solar cell according to claim 1, wherein the first electrode structure comprises:

a first electroconductive layer arranged on a side of the first doped semiconductor layer away from the first passivation layer; and a first electrode arranged on a side of the first electroconductive layer away from the first doped semiconductor layer;

the second electrode structure comprises:

a second electroconductive layer arranged on a side of the second doped semiconductor layer away from the second passivation layer; and a second electrode arranged on a side of the second electroconductive layer away from the second doped semiconductor layer, wherein:

a material of each of the first and second electroconductive layers comprises at least one of zinc oxide, indium oxide, and tin oxide;

each of the first and second electroconductive layers is doped with at least one of gallium element, tin element, titanium element, zirconium element, molybdenum element, cerium element, fluorine element, tungsten element, and aluminum element; and each of the first and second electroconductive layers has a thickness ranging from 10 nm to 120 nm.

11. The back contact solar cell according to claim 1, wherein:

the first passivation layer comprises tunneling oxide and has a thickness ranging from 0.5 nm to 2.5 nm;

the first doped semiconductor layer comprises doped polysilicon and has a thickness ranging from 10 nm to 250 nm;

the second passivation layer comprises intrinsic amorphous silicon and has a thickness ranging from 1 nm to 15 nm; and the second doped semiconductor layer comprises doped amorphous silicon and/or microcrystalline silicon and has a thickness ranging from 1 nm to 60 nm.

12. The back contact solar cell according to claim 1, further comprising:

a third functional layer and an anti-reflection layer that are located on the light-receiving surface of the semiconductor substrate and stacked in the direction away from the semiconductor substrate, wherein:

the third functional layer comprises at least one of intrinsic amorphous silicon, a composite layer of intrinsic amorphous silicon and doped thin film silicon, silicon oxide, a stacked layer of silicon oxide and doped polysilicon laminated, silicon nitride, silicon nitride oxide, and aluminum oxide; and the anti-reflection layer comprises at least one of silicon oxide, silicon nitride, silicon nitride oxide, aluminum oxide, transparent electroconductive oxide, and magnesium fluoride.

13. A battery assembly, comprising:

the back contact solar cell according to claim 1.

14. A method for preparing a back contact solar cell, comprising:

providing a semiconductor substrate, the semiconductor substrate having a light receiving surface and a shady surface that are opposite to each other, the shady surface comprising a first polarity region and a second polarity region arranged alternately in a first direction;

forming a first functional layer in the first polarity region, the first functional layer comprising a first passivation layer and a first doped semiconductor layer that are stacked in a direction away from the semiconductor substrate;

forming a second functional layer in the second polarity region, the second functional layer comprising a second passivation layer and a second doped semiconductor layer that are stacked in a direction away from the semiconductor substrate, the first doped semiconductor layer having a doping type opposite to a doping type of the second doped semiconductor layer;

forming a laser protection layer on a side of the second functional layer away from the semiconductor substrate, the laser protection layer comprising a laser absorption material;

removing a part of a film layer corresponding to an electrode contact region of the first functional layer on a side of the first functional layer away from the semiconductor substrate and a part of a film layer corresponding to an electrode contact region of the second functional layer on the side of the second functional layer away from the semiconductor substrate to expose the electrode contact regions; and forming an electrode structure in each of the electrode contact region of the first functional layer and the electrode contact region of the second functional layer, wherein forming the first functional layer in the first polarity region comprises forming a doped substrate layer located in the first polarity region and in direct contact with the first passivation layer, the doped substrate layer having a same doping type as the first doped semiconductor layer, wherein a surface of the doped substrate layer close to the first passivation layer is a polished surface, and the doped substrate layer is in direct contact with the second passivation layer formed in the second polarity region in the first direction.

15. The method according to claim 14, wherein said forming the laser protection layer on the side of the second functional layer away from the semiconductor substrate comprises:

forming an insulation dielectric layer on the side of the second functional layer away from the semiconductor substrate;

forming a laser absorption layer on a side of the insulation dielectric layer away from the semiconductor substrate, the laser absorption layer comprising a laser absorption material.

16. The method according to claim 15, wherein:

the first functional layer is covered by the formed second functional layer; and said removing the part of the film layer corresponding to the electrode contact region of the first functional layer on the side of the first functional layer away from the semiconductor substrate comprises:

removing, by laser ablation, a part of the laser absorption layer corresponding to the electrode contact region of the first functional layer, removing, by wet etching, a part of the insulation dielectric layer corresponding to the electrode contact region of the first functional layer, and removing, by laser ablation, a part of the second functional layer corresponding to the electrode contact region of the first functional layer; or removing, by laser ablation, the part of the laser absorption layer, the part of the insulation dielectric layer, and the part of the second functional layer that correspond to the electrode contact region of the first functional layer.

17. The method according to claim 16, wherein:

a first orthographic projection of the first functional layer on the semiconductor substrate at least partially overlaps with a second orthographic projection of the second functional layer on the semiconductor substrate; and said forming the electrode structure in each of the electrode contact region of the first functional layer and the electrode contact region of the second functional layer comprises:

forming an electroconductive layer on each of the side of the first functional layer away from the semiconductor substrate and the side of the second functional layer away from the semiconductor substrate;

forming, by laser ablation, an opening on the laser protection layer within an orthographic projection of the laser protection layer on the semiconductor substrate, the opening at least cutting off the electroconductive layer and at most exposing the first functional layer; and forming an electrode on each of a side, away from the semiconductor substrate, of a contact portion between the electroconductive layer and the electrode contact region of the first functional layer and a side, away from the semiconductor substrate, of a contact portion between the electroconductive layer and the electrode contact region of the second functional layer.

18. The method according to claim 15, wherein said removing the part of the film layer corresponding to the electrode contact region of the second functional layer on the side of the second functional layer away from the semiconductor substrate comprises:

removing, by laser ablation, a part of the laser absorption layer corresponding to the electrode contact region of the second functional layer; and removing, by wet etching, a part of the insulation dielectric layer corresponding to the electrode contact region of the second functional layer.

19. The method according to claim 14, further comprising, subsequent to said providing the semiconductor substrate:

performing treatment on a surface of the semiconductor substrate to turn the light-receiving surface into a textured surface, and turn a surface of the first polarity region and a surface of the second polarity region into a polished surface.

20. The method according to claim 19, wherein said performing the treatment on the surface of the semiconductor substrate comprises:

texturing the light-receiving surface and the shady surface of the semiconductor substrate;

forming a first mask on the light-receiving surface of the semiconductor substrate;

polishing the shady surface of the semiconductor substrate; and removing the first mask.

* * * * *